(12) United States Patent
Hashisaka et al.

(10) Patent No.: US 12,216,143 B2
(45) Date of Patent: Feb. 4, 2025

(54) VOLTAGE CURRENT CONVERSION DEVICE

(71) Applicant: Nippon Telegraph and Telephone Corporation, Tokyo (JP)

(72) Inventors: Masayuki Hashisaka, Musashino (JP); Koji Muraki, Musashino (JP); Takafumi Akiho, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 140 days.

(21) Appl. No.: 17/911,253

(22) PCT Filed: Mar. 18, 2020

(86) PCT No.: PCT/JP2020/012152
§ 371 (c)(1),
(2) Date: Sep. 13, 2022

(87) PCT Pub. No.: WO2021/186653
PCT Pub. Date: Sep. 23, 2021

(65) Prior Publication Data
US 2023/0113379 A1    Apr. 13, 2023

(51) Int. Cl.
*G01R 19/00* (2006.01)
*G01R 19/32* (2006.01)
(Continued)

(52) U.S. Cl.
CPC ..... *G01R 19/0092* (2013.01); *G01R 19/0023* (2013.01); *G01R 19/32* (2013.01); *H01L 29/778* (2013.01); *H03F 3/04* (2013.01)

(58) Field of Classification Search
CPC ............ G01R 19/0092; G01R 19/0023; G01R 19/32; H01L 29/778; H03F 3/04;
(Continued)

(56) References Cited

U.S. PATENT DOCUMENTS

2008/0204149 A1    8/2008   Suzuki et al.
2010/0102358 A1    4/2010   Lanzieri et al.
(Continued)

FOREIGN PATENT DOCUMENTS

JP    H03-6029 A      1/1991
JP    H04-107004 A    4/1992
(Continued)

OTHER PUBLICATIONS

JP 2009010910 Machine Translation, Jan. 15, 2009 (Year: 2009).*
(Continued)

*Primary Examiner* — Raul J Rios Russo
(74) *Attorney, Agent, or Firm* — Workman Nydegger

(57) ABSTRACT

When a current-to-voltage converter is used at low temperatures, the frequency band of measurable small currents is limited. Stray capacitance of a coaxial cable that takes out an output voltage of the current-to-voltage converter from inside to outside a cooling device narrows the operating frequency band of the current-to-voltage converter. The current-to-voltage converter of the present disclosure uses elements exclusively optimized for low-temperature operation (e.g., HEMTs) as electronic elements for current-to-voltage conversion. This configuration realizes current-to-voltage conversion characteristics with significantly more excellent sensitivity than that of the conventional technique even when the current-to-voltage converter is operated at a low temperature of 150K or less or in cryogenic temperature conditions close to absolute zero. Further, a source follower circuit is added to an output stage of the current-to-voltage conversion circuit to isolate the effect of stray capacitance added to the output side of the current-to-voltage conversion circuit and achieve a wider bandwidth.

9 Claims, 5 Drawing Sheets

(51) Int. Cl.
*H01L 29/778* (2006.01)
*H03F 3/04* (2006.01)

(58) Field of Classification Search
CPC ...... H03F 1/483; H03F 2200/54; H03F 1/223; H03F 1/34
USPC ..................................................... 324/123 R
See application file for complete search history.

(56) References Cited

U.S. PATENT DOCUMENTS

| | | | | |
|---|---|---|---|---|
| 2017/0272040 | A1* | 9/2017 | Huffenus | H03F 1/086 |
| 2019/0028065 | A1* | 1/2019 | Mahon | H03F 1/301 |
| 2020/0144970 | A1* | 5/2020 | Mahon | H03F 3/21 |
| 2020/0264217 | A1* | 8/2020 | Costa | H04B 10/07955 |
| 2023/0083321 | A1* | 3/2023 | Hashisaka | H03F 3/68 |
| | | | | 363/13 |
| 2023/0120951 | A1* | 4/2023 | Hashisaka | H01L 29/812 |
| | | | | 363/65 |

FOREIGN PATENT DOCUMENTS

| | | |
|---|---|---|
| JP | H08-162859 A | 6/1996 |
| JP | 2009-10910 A | 1/2009 |
| JP | 2010-506397 A | 2/2010 |
| JP | 2015-50464 A | 3/2015 |

OTHER PUBLICATIONS

JP 2010506397 Machine Translation, Feb. 25, 2010 (Year: 2010).*
Masayuki Hashisaka et al., *Cross-Correlation Measurement of Quantum Shot Noise Using Homemade Transimpedance Amplifiers*, Review of Scientific Instruments, vol. 85, 2014, pp. 1-7.
Pam-Xiamen, *GaAs Hemt Epi Wafer*, PAX-XIAMEN (Xiamen Powerway Advanced Material Co., Ltd.), Nov. 19, 2013, pp. 1-4.

* cited by examiner

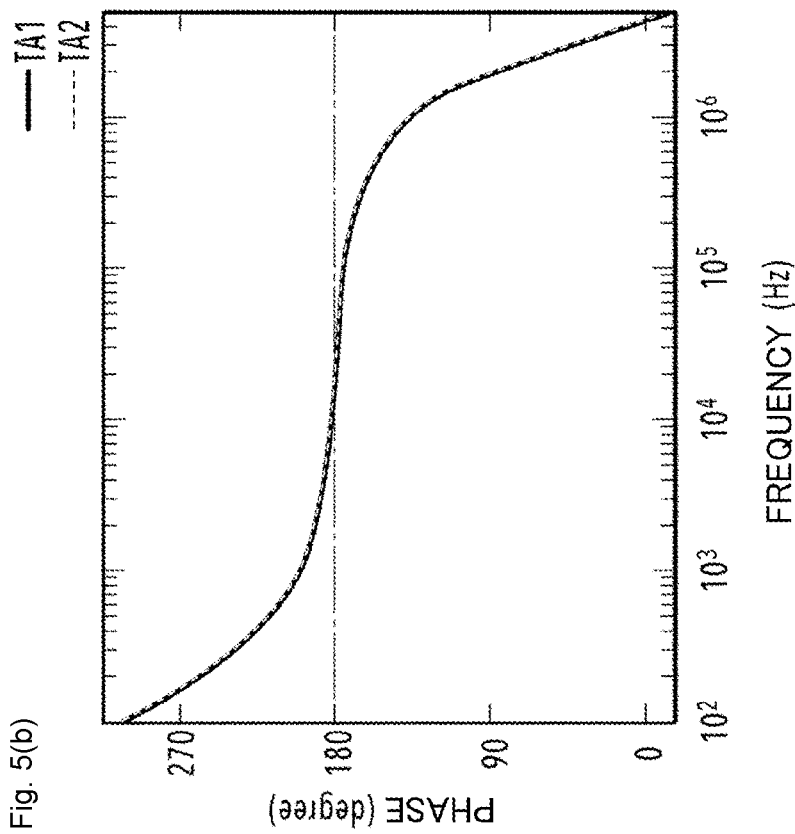
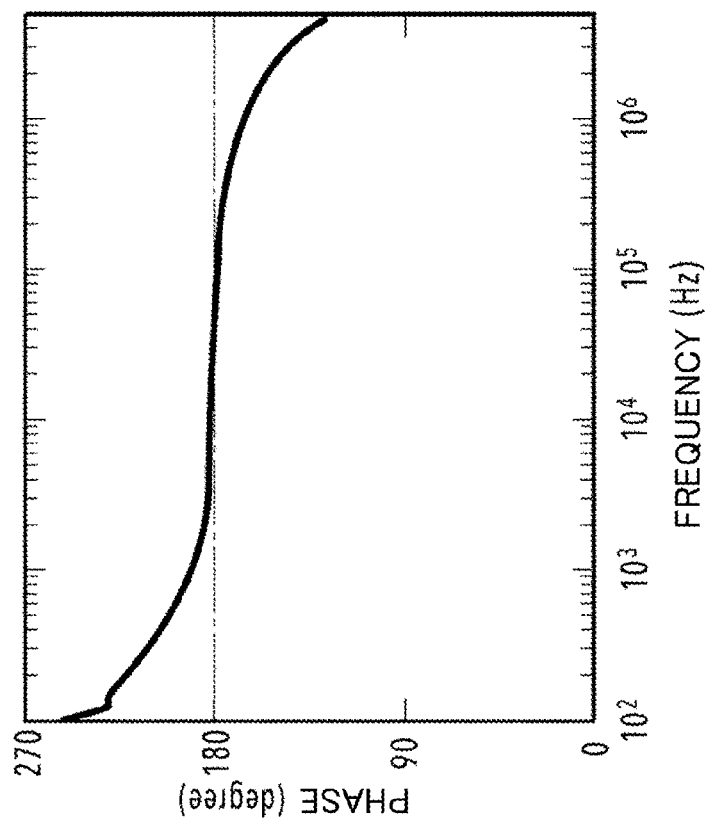
Fig. 5(a)
Fig. 5(b)

VOLTAGE CURRENT CONVERSION DEVICE

TECHNICAL FIELD

The present invention relates to an electronic circuit that converts current to voltage.

BACKGROUND ART

It is known that in order to measure the current, a target current is converted to a voltage and is measured using a voltmeter. To accurately read a small current, it is necessary to convert the current to a voltage using a low-noise electronic circuit. In order to realize this, a method of reducing thermal noise by using a current-to-voltage converter at a low temperature is used. For current signals in the ultra-long to short wave band (1 kHz to 30 MHz), a current-to-voltage converter using low-power field-effect transistors (FETs) that operate at low temperatures has been reported (NPL 1).

FIG. 1 shows a schematic configuration of a current-to-voltage conversion circuit of a conventional current-to-voltage converter (NPL 1). In a current-to-voltage conversion circuit 10, a terminal (current source) from which a target current to be measured flows is connected to an input terminal 11, and a converted voltage corresponding to the target current is measured at an output terminal 14. Current-to-voltage conversion is realized by amplifying signals using four FETs (H1 to H4) and feeding back a source output signal of H4 at the final stage to a gate of H1 on the input side. The conventional current-to-voltage conversion circuit uses generally available FETs that operate at room temperature. For example, the current-to-voltage converter of NPL 1 uses pseudomorphic high electron mobility transistors (HEMT: High Electron Mobility Transistors).

CITATION LIST

Non Patent Literature

Hashisaka et. al., "Cross-correlation measurement of quantum shot noise using homemade transimpedance amplifiers", 2014, Rev. Sci. Instrum. 85, 054704

PAM-XIAMEN GaAs HEMT Epi wafer product catalog page, [online], retrieved on Mar. 6, 2020, Internet <URL: https://www.powerwaywafer.com/gaas-hemt-epi-wafer.html

SUMMARY OF THE INVENTION

Technical Problem

However, when the current-to-voltage converter is used at low temperatures, the frequency band of small currents that can be measured is limited. As described later, it is assumed that the current-to-voltage converter is used in combination with a cooling device when measuring small currents with high sensitivity at low temperatures. In this case, a coaxial cable or the like is used to extract an output voltage from inside to outside the cooling device. Stray capacitance of the coaxial cable connected to the output side of the current-to-voltage converter narrows the operating frequency band of the current-to-voltage converter.

The present invention has been made in view of the foregoing problems, and an object of the invention is to provide a means for sensitively measuring small currents in a broad band in extremely low-temperature conditions.

Means for Solving the Problem

To achieve the above object, one embodiment of the present invention is a current-to-voltage converter including: an amplification unit having at least three stages each including an electronic element, a target current being fed to a first stage, a final stage constituting a source follower configured to feed back an output signal to the first stage, the amplification unit being configured to convert the target current to a voltage; and a buffer unit that is connected to the amplification unit, constitutes a source follower including the electronic element, and is configured to output the converted voltage, wherein the electronic element is a field-effect transistor (FET) adapted to operation at a temperature of 150 K or less.

Effects of the Invention

Small currents can be measured sensitively in a broad band in extremely low-temperature conditions.

BRIEF DESCRIPTION OF DRAWINGS

FIG. 5 shows frequency characteristics of a phase difference between input and output in comparison with the conventional technology.

DESCRIPTION OF EMBODIMENTS

The following disclosure relates to a current-to-voltage converter that sensitively measures small currents in a broad band even in extremely low-temperature conditions. A current-to-voltage converter of the present disclosure uses elements exclusively optimized for low-temperature operation (e.g., HEMTs) as electronic elements for current-to-voltage conversion. This configuration makes it possible to achieve current-to-voltage conversion characteristic with significantly more excellent sensitivity than that of the conventional technique even if the current-to-voltage converter is operated at a low temperature of 150 K or less or in cryogenic temperature conditions close to absolute zero. Further, a source follower circuit is added to the output stage of the current-to-voltage conversion circuit to isolate the effect of stray capacitance added to the output side of the current-to-voltage conversion circuit and achieve a wider bandwidth.

Referring to FIG. 1 again, the FETs H1 to H4 used in a current-to-voltage conversion circuit 10 are based on the premise of also operating at room temperature. In general, electronic elements have different operating performance depending on the temperature at which they are used. In the case of a current-to-voltage conversion circuit, all the characteristics and operating requirements such as power supply voltage to be fed to the FETs, conversion efficiency, and noise characteristics vary with temperature. For example, the pseudomorphic FETs of the current-to-voltage converter disclosed in NPL 1 are generally available electronic devices, and operate at both room temperature and low temperatures. This is because the ability to operate at room temperature in a test of electronic elements makes it possible to first perform characterization at room temperature and then selectively and optionally perform costly low-temperature evaluation. In terms of efficiency of testing during mass production of electronic elements and ease of use and evaluation at room temperature, there are significant advantages for both suppliers and users in fabricating electronic elements that operate at room and low temperatures.

However, the current-to-voltage conversion characteristics of FETs operating at both room and low temperatures are inadequate in situations where the FETs are cooled to near absolute zero to measure small currents, such as cosmic rays, quantum device signals, or "quantum fluctuations" of a current. The inventors thought that if the electronic elements used in the conventional current-to-voltage converter were specialized only for operation and performance at low temperatures, more favorable low-noise characteristics could be obtained in low-temperature conditions.

Figure 1:
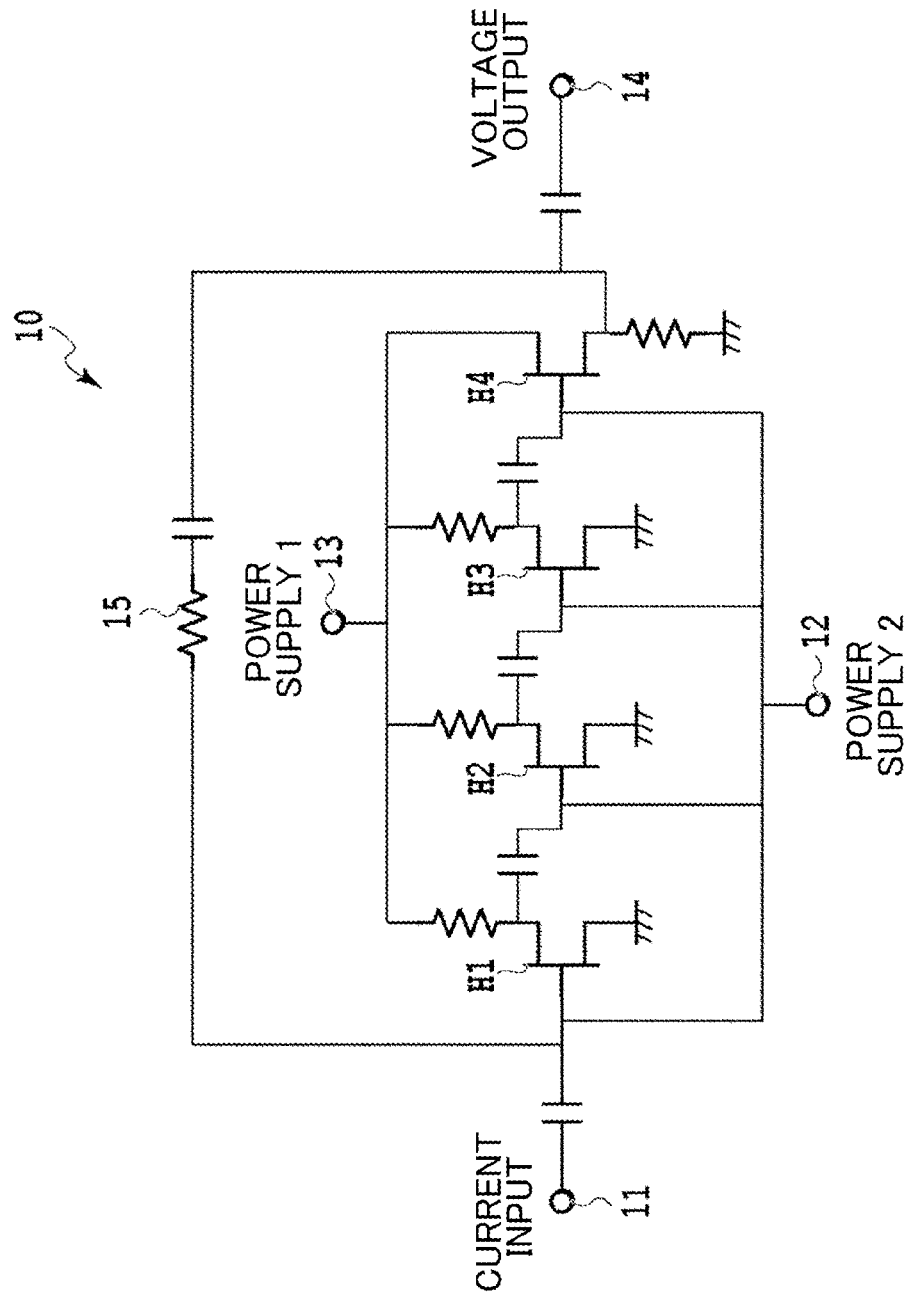
FIG. 1 shows a schematic configuration of a conventional current-to-voltage conversion circuit.
Figure 2:
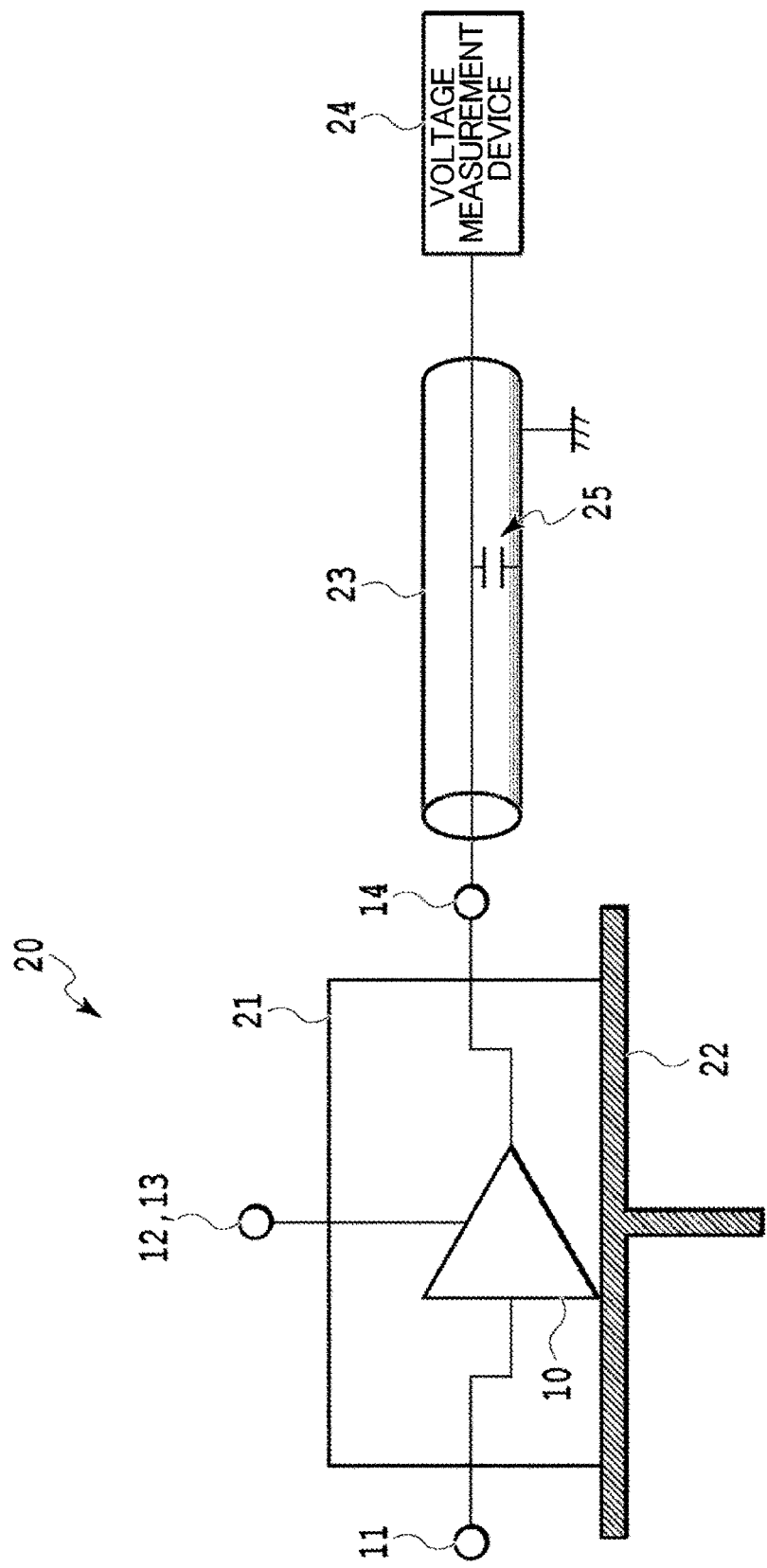
FIG. 2 illustrates a configuration of a measurement system including a current-to-voltage converter that is operated at low temperatures.

FIG. 2 illustrates a configuration of a measurement system including a current-to-voltage converter that is operated at low temperatures. Another problem with conventional current-to-voltage converter is a limitation on the operating bandwidth that occurs when the current-to-voltage converter is used in low-temperature conditions. In a current-to-voltage converter 20 in FIG. 2, the current-to-voltage conversion circuit 10 shown in FIG. 1 is arranged within a cooling device, which has, for example, a cooling stage 22 and a case 21 of the cooling stage 22. Although the current-to-voltage conversion circuit 10 is symbolically shown by a symbol of an amplifier, in practice, the current-to-voltage conversion circuit 10 may be a package of the plurality of elements (FETs) shown in FIG. 1 and other elements on a circuit board. Furthermore, the current-to-voltage conversion circuit 10 may be a circuit in which this package is contained in a case made of oxygen-free copper or the like, and this case is arranged on the stage 22. A current input terminal 11, a voltage output terminal 14, and two power supply terminals 12 and 13 are taken out from inside the case 21.

When the current-to-voltage conversion circuit 10 is used in combination with a cooling device, the voltage output terminal 14 is connected to a voltage measurement device 24 by a coaxial cable 23 in order to prevent noise contamination when measuring small currents.

The cooling device can take various forms, but one example is a dilution refrigerator. The dilution refrigerator is a cylindrical can having a diameter of 0.5 to 1 m×a height of about 2 m that contains the above-described current-to-voltage conversion circuit 10 and has a mechanism for circulating helium inside the can. External mechanisms such as a pump and a compressor for helium circulation, which are not shown in FIG. 2, may also be included. Examples of other types of available cooling devices and cooling temperatures include, for example: a dilution refrigerator: about 10 mK to 1 K, a 3He refrigerator: about 300 mK, a 4He refrigerator: about 1.5K, liquid helium: 4.2 K, liquid nitrogen: 77 K, and a refrigerant-free pulse tube refrigerator: 1.5 K to 300 K. Note that the form of the case and cooling stage varies depending on the type of cooling device.

For simplicity, FIG. 2 shows the coaxial cable 23 that is used from outside the case 21 of the cooling device. In the case of a relatively large dilution refrigerator or the like, there are also cases where a coaxial cable is used from the inside of a can (case) in a low-temperature environment to extract signals to the voltage measurement device 24 in a room-temperature environment.

If the cooling device is large, there are cases where the length of the coaxial cable is more than 1 m.

The coaxial cable has stray capacitance, and a phase shift of the output signal occurs in the current-to-voltage conversion circuit due to the effect of the stray capacitance. Since the stray capacitance, together with output impedance of the current-to-voltage conversion circuit, constitutes a low-pass filter, the amount of phase shift becomes more significant at higher frequencies. As a result, an upper limit is imposed on the operating frequency of the current-to-voltage converter. In order to extend the operating frequency to the higher frequency side, the stray capacitance of the coaxial cable should be reduced. However, it is usually difficult to reduce the stray capacitance in current-to-voltage converters since the size of the cooling device determines the required length of the coaxial cable. In order to increase the bandwidth of current-to-voltage converters, it is necessary to devise a unique means for reducing the effect of stray capacitance on the output side.

The current-to-voltage converter of the present disclosure simultaneously solves the aforementioned problem of the operating frequency during low-temperature operation by using electronic elements (FETs) specifically configured for low-temperature operation and by the unique configuration of the current-to-voltage conversion circuit.

Figure 3:
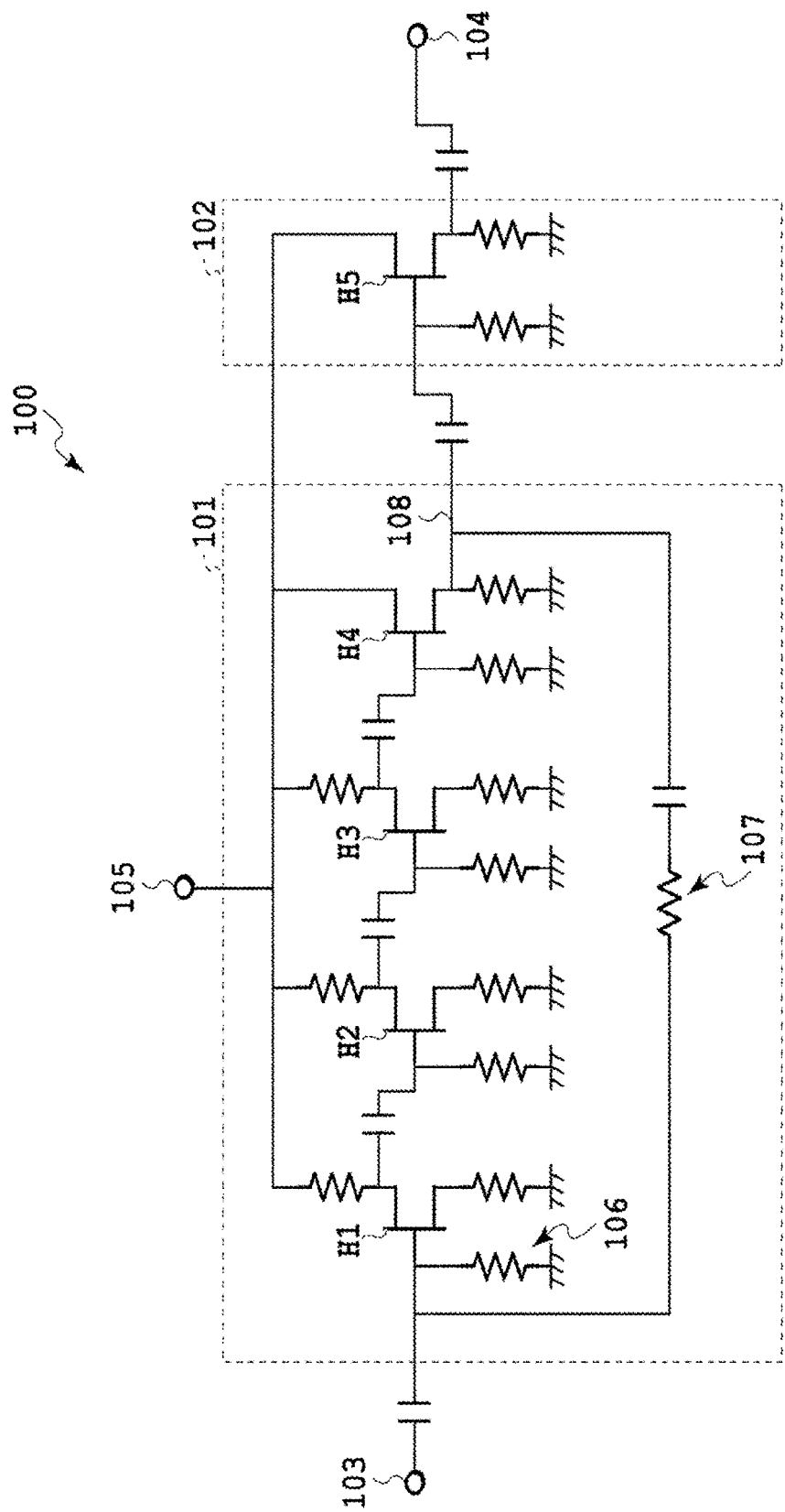
FIG. 3 shows a configuration of a current-to-voltage conversion circuit of a current-to-voltage converter of the present disclosure.

FIG. 3 shows a configuration of a current-to-voltage conversion circuit in a current-to-voltage converter of the present disclosure. The current-to-voltage conversion circuit 100 is roughly divided into a current-to-voltage conversion unit 101 and an output-stage source follower unit 102. The current-to-voltage conversion unit 101 is similar to that in FIG. 1 in its basic amplifier configuration, and includes three FETs (H1 to H3) that constitute common source voltage amplifier stages and a final output stage FET (H4) that is a source follower. An output voltage 108 from the source of H4 is fed back to the gate of H1 via a feedback resistor 107. The gates to the FETs are set to a ground potential by gate resistors 106, and each FET is self-biased by a source resistor using power from a single power supply terminal 105. In the current-to-voltage conversion unit 101, a target current is fed to a first stage, and a final stage constitutes a source follower that feeds back an output signal to the first stage. The current-to-voltage conversion unit 101 functions as an amplifier that converts the target current to a voltage.

The output-stage source follower unit 102 is not included in the conventional current-to-voltage conversion circuit 10 in FIG. 1. That is, in the current-to-voltage conversion circuit 100 of the present disclosure, the FET (H5) of the output-stage source follower unit 102 prevents the frequency band of the current-to-voltage conversion circuit 100 from narrowing due to stray capacitance of a cable when a coaxial cable or the like is connected to the downstream side of an output voltage terminal 104. In general, a source follower at an output of an electronic circuit is used to reduce output impedance of the electronic circuit and avoid variations in the operation of this electronic circuit itself that it undergoes due to the connection to the next stage circuit.

In the case of measurement of small currents at room temperature at which current consumption is not limited, a large current can be applied to the source follower (H4) of the current-to-voltage conversion unit 101. However, it was found that a single-stage source follower was not sufficient when a current-to-voltage converter is used at cryogenic temperatures while using a cooling device. There is a limit to the current consumption that can be allocated to the source follower FET (H4) in the conventional configuration in FIG. 1, and the output impedance of the source follower cannot be reduced sufficiently. Therefore, the output-stage source follower unit 102 is further provided, making it possible to prevent deterioration of the frequency characteristics in the current-to-voltage conversion characteristics due to the stray capacitance of the coaxial cable. The output-stage source follower unit 102 is considered to be acting as an isolator to isolate the stray capacitance of the coaxial cable so that the stray capacitance is not visible from the current-to-voltage conversion unit 101 side, rather than lowering the output impedance of the current-to-voltage conversion circuit. Therefore, the output-stage source follower unit 102 constitutes a source follower that includes an electronic element, and functions as a buffer unit that outputs a voltage obtained by converting the target current.

By using low-current FETs specialized for low-temperature operation, which will be discussed later, the increase in the number of amplification stages (from 4 to 5) can be compensated for, and smaller power consumption can also be achieved in the entire current-to-voltage conversion circuit. At the same time, broadband measurement of small currents in cryogenic temperatures is realized.

Characteristics of the current-to-voltage converter of this disclosure lie in that FETs with a configuration specialized for low-temperature operation are used as the FETs (H1 to H5) of the current-to-voltage conversion circuit in FIG. 3. Examples of FETs specialized for low-temperature operation include GaAs-based HEMTs, specifically n-AlxGai-xAs/GaAs HEMTs and GaAs quantum well HEMTs. GaAs-based HEMTs exhibit high electron mobility at low temperatures, and therefore operate as broadband and low-noise FETs and facilitate fabrication of elements with large transconductance at low temperatures.

Figure 4A:
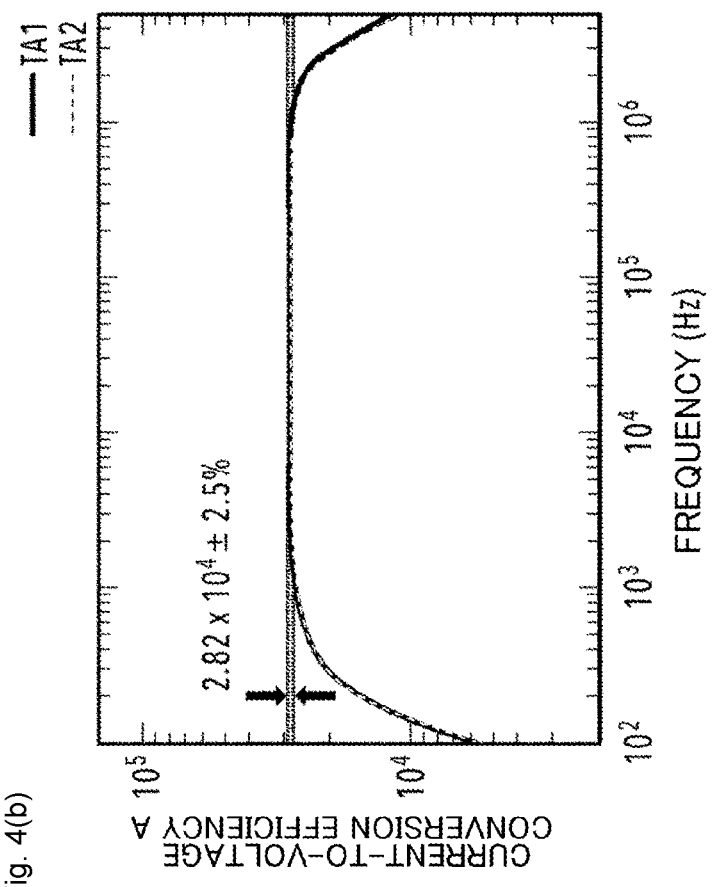
FIG. 4 shows frequency characteristics of current-to-voltage conversion efficiency compared to those of the conventional technique.
Figure 4B:
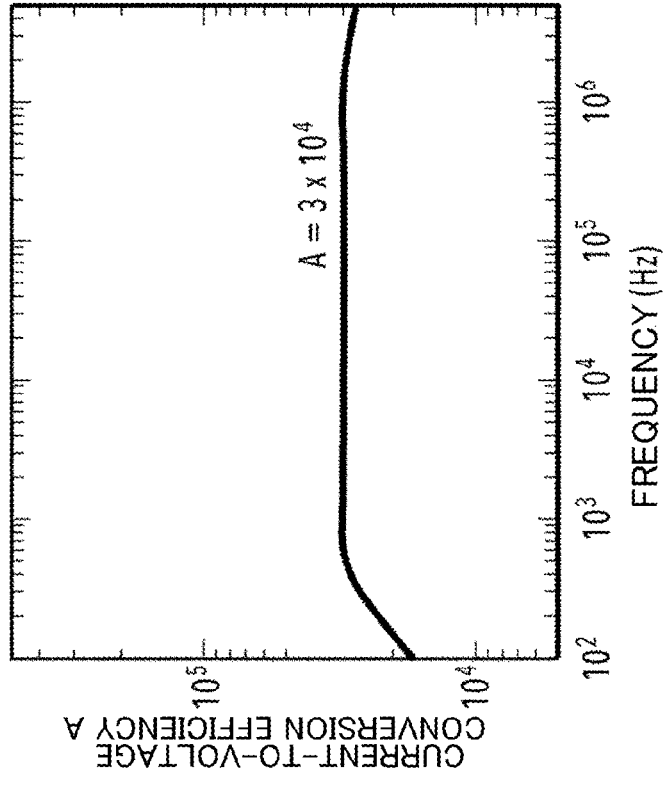

FIG. 4 shows frequency characteristics of the current-to-voltage conversion efficiency of the current-to-voltage converter of the present disclosure in comparison to the conventional technique. FIG. 4(b) shows the current-to-voltage conversion efficiency A at a temperature 4 K in the case where the conventional current-to-voltage conversion circuit 10 shown in FIG. 1 uses FETs capable of operating at room and low temperatures. Specifically, AVAGO ATF35143, which is generally used in low temperature experiments, was used. The current-to-voltage conversion efficiency A is adjusted to $2.82 \times 10^4$ V/A by adjusting the feedback resistance. From FIG. 4(b), the highest frequency at which the deviation from the set value of A is ±2.5% (which will be referred to as an upper-limit operating frequency) was 1 MHz. The maximum frequency of 1 MHz is generally reached with both of the two samples (TA1 and TA2).

Meanwhile, FIG. 4(a) shows the current-to-voltage conversion efficiency at a temperature 4 K in the case where the current-to-voltage conversion circuit 100 of the present disclosure shown in FIG. 3 uses FETs specialized for low-temperature operation. Specifically, a GaAs—AlGaAs HEMT with a channel width of 3 mm is used. The current-voltage conversion efficiency A is adjusted to $3.0 \times 10^4$ V/A by adjusting the feedback resistor 107, similarly to FIG. 4(b). From FIG. 4(a), the maximum frequency (upper-limit operating frequency) at which the deviation from the set conversion efficiency value is ±2.5% is 5 MHz. Comparing the two characteristics in FIGS. 4(a) and 4(b) in which the current-to-voltage conversion efficiency A is set to approximately the same value, it can be understood that the operating band is wider with the configuration of the present disclosure with the addition of the output-stage source follower unit 102.

FIG. 5 shows the frequency characteristics of the input-output phase difference in the current-to-voltage converter of the present disclosure in comparison with the conventional technique. FIGS. 5(a) and 5(b) correspond to the respective characteristics in FIGS. 4(a) and 4(b), and show the phase difference between the input signal to the element H1 at the first stage and the output signal at the last stage in degrees (°). The current-to-voltage conversion circuits shown in FIGS. 1 and 3 are both set to have values of the feedback resistor and feedback capacitor so as to have negative feedback under normal operating conditions at the center frequency of the operating band. The phase difference between input and output under normal operating conditions is 180°. The amount of phase rotation gradually increases from 180° under the normal operating conditions together with the operating frequency due to stray capacitance or the like added to the output side of the current-to-voltage conversion circuit by a cable or the like.

In the configuration of the present disclosure with the addition of the output-stage source follower unit 102, the phase difference at the upper-limit operating frequency of 5 MHz is 130°, as shown in FIG. 5(a), resulting in a phase rotation of 50° from the phase during the normal operation. On the other hand, in the conventional configuration, the phase difference at the same frequency of 5 MHz reaches 0°, as shown in FIG. 5(b), and the amount of phase rotation from the phase during the normal operation extends to 180°. From FIGS. 5(a) and 5(b) as well, it can be understood that the operating band of the current-to-voltage conversion circuit is wider with the configuration of the present disclosure with the addition of the output-stage source follower unit 102.

Accordingly, the current-to-voltage converter of the present disclosure can be implemented as a current-to-voltage converter including: an amplification unit having at least three stages each including an electronic element, a target current being fed to a first stage, a final stage constituting a source follower configured to feed back an output signal to the first stage, the amplification unit being configured to convert the target current to a voltage; and a buffer unit that is connected to the amplification unit, constitutes a source follower including the electronic element, and is configured to output the converted voltage. Here, the electronic element is a field-effect transistor (FET) adapted to operation at a temperature of 150 K or less.

Here, a description will be given of characteristics between the FET that operates at both room and low temperatures used in the conventional current-to-voltage converter and the FET specialized for low-temperature operation used in the current-to-voltage converter of the present disclosure. The HEMTs (FETs) used in the current-to-voltage conversion circuit 100 shown in FIG. 3 have a GaAs—AlGaAs modulation-doped superlattice structure. Pseudomorphic HEMTs and InP-based HEMTs can also be used. These HEMTs can operate at low temperatures and have excellent noise characteristics.

In HEMTs, the configuration of the channel portion is related to the sensitivity of detection for small currents. Considering the cross-sectional structure of the HEMTs, the channel is formed between the drain and the source. A current at the channel is controlled by an input signal to the gate. In the case of a HEMT that operates at room temperature, the thickness d of the gate insulating layer needs to be sufficiently large in order to reduce leakage current between the channel and the gate. Accordingly, the HEMT capable of operating at both room and low temperatures usually has an insulating layer thickness d of 100 nm or more. Meanwhile, the larger the thickness d, the smaller the response to a change in gate voltage, and the lower the detection sensitivity to an input signal to the gate.

In the GaAs—AlGaAs HEMT with a channel width of 3 mm specialized for low-temperature operation used in the current-to-voltage converter of the present disclosure, the insulating layer thickness d at a temperature 4 K is set to be 100 nm or less; more specifically, 55 nm. When this HEMT is used as an amplifier element, the electrical resistance between the gate and the channel is 200 kΩ/mm in actual measurement at room temperature. Thus, this HEMT cannot be used due to its large leakage behavior. In contrast, for example, at liquid helium temperature (4.2K), the electrical resistance between the gate and the channel is 1 GΩ/mm or more, and thus the leakage current can be ignored. By abandoning normal operation at room temperature and using a HEMT specialized for low-temperature operation, the current detection sensitivity of the HEMT serving as the current-to-voltage conversion circuit for cryogenic temperature can be greatly improved.

In HEMTs for room-temperature operation, it is important in general to suppress leakage between the gate and the channel. In GaAs—AlGaAs HEMTs, the gate and the channel are naturally insulated since the Schottky barrier is formed. However, the insulating layer needs to be made thick to some extent. A configuration of a commonly available GaAs—AlGaAs HEMT is disclosed, for example, in NPL 2, where the thickness of the insulating layer is 210 nm, although the amount of doping is not mentioned. Although different materials require different insulating layer thicknesses, a thickness of 100 nm or more is generally considered to be common in the case of GaAs—AlGaAs. The current-to-voltage converter of the present disclosure adopts a configuration specialized for low-temperature operation, with a gate insulating layer having a thickness of 100 nm or less, which cannot be selected for room temperature operation, thereby realizing significantly more excellent current-to-voltage conversion characteristics than those of the conventional technique. At the same time, a wider bandwidth is realized by the configuration with the addition of the output-stage source follower unit 102.

Here, the configuration of the HEMT specialized for low-temperature operation will be mentioned further. In a current-to-voltage conversion circuit, the shorter the distance between the gate and the channel and the thinner the gate insulating layer, the better in order to increase the current detection sensitivity, as mentioned above. Further, the larger the amount of change in channel current (transconductance) with respect to the gate voltage, the better. Thus, the larger the amount of doping, the higher the current detection sensitivity.

However, the two conditions of the gate insulating layer thickness and the doping amount can only be optimized within the range where no carrier is generated in the gate insulating layer. It is known that beyond this range, a gate leakage current occurs at room temperature, and parallel conduction reduces mobility and degrades HEMT characteristics. If carriers are generated in the gate insulating layer of the HEMT and a gate leakage current flows, the HEMT cannot be used as a current-to-voltage conversion circuit, or even as an electronic element as it does not have the basic operation and performance at room temperature.

In order to ensure the aforementioned basic operation as an electronic element, most of the commercially available HEMTs have a barrier layer, which is a part of the gate insulating layer, with a thickness of 100 nm or more, for example. According to NPL 2, the barrier layer is 180 nm, and the total gate thickness of the three-layer structure is 210 nm. A HEMT with a configuration having such a thick gate insulating layer is a barrier to highly sensitive measurements conducted at low temperatures.

In the current-to-voltage conversion circuit of the present disclosure, a current-to-voltage conversion circuit was prototyped using HEMTs with a gate insulating layer thickness of 55 nm to which delta doping ($6 \times 10^{11}$ cm$^{-2}$) was performed twice (equivalent to a channel carrier density of $4 \times 10^{11}$ cm$^{-2}$), and excellent noise performance was confirmed. These HEMTs have a gate resistor with an electrical resistance of 200 kΩ/mm in actual measurement at room temperature, and cannot be used as HEMTs at room temperature due to leakage current. However, by using the above-described HEMT specialized for low-temperature operation at very low temperatures and adopting the configuration with the addition of the output-stage source follower unit as shown in FIG. 3, broadband measurement with high sensitivity and low power consumption can be achieved as shown in FIGS. 4 and 5. As a possible guide for a HEMT configuration specialized for low-temperature operation, the gate insulating layer thickness is 100 nm or less, preferably 55 nm or less, and the doping amount is more than equivalent to a channel carrier density of $4 \times 10^{11}$ cm$^{-2}$.

As described in detail above, the current-to-voltage converter of the present disclosure can realize sensitive and broadband measurement of small currents in extremely low-temperature conditions.

INDUSTRIAL APPLICABILITY

The present invention can be used in highly sensitive and broadband measurement of small currents.

REFERENCE SIGNS LIST

10, 100 Current-to-voltage conversion circuit
11, 103 Current input terminal
12, 13, 105 Power supply terminal
14, 104 Voltage output terminal
15, 107 Feedback resistor
20 Current-to-voltage converter
21 Case
22 Cooling stage
23 Coaxial cable
24 Voltage measurement device
25 Stray capacitance
108 Drain output voltage

The invention claimed is:

1. A current-to-voltage converter comprising:
    an amplification unit having at least three stages each including a field-effect transistor (FET), a target current being fed to a first stage, a final stage constituting a source follower configured to feed back an output signal to the first stage, the amplification unit being configured to convert the target current to a voltage; and
    a buffer unit that is connected to the amplification unit, constitutes a source follower including a FET, and is configured to output the converted voltage,
    wherein each FET is adapted to operation at a temperature of 150 K or less.

2. The current-to-voltage converter according to claim 1, wherein the amplification unit has four common source voltage amplifier stages.

3. The current-to-voltage converter according to claim 1, wherein
each FET is a high electron mobility transistor (HEMT), and has a gate insulating layer is 100 nm or less.

4. The current-to-voltage converter according to claim 3, wherein
the HEMT is a HEMT with a GaAs—AlGaAs modulation-doped superlattice structure, a pseudomorphic HEMT, or an InP-based HEMT.

5. A small current measurement device comprising the current-to-voltage converter according to claim 1, the current-to-voltage converter being provided within a cooling device.

6. The current-to-voltage converter according to claim 2, wherein
each FET is a high electron mobility transistor (HEMT), and has a gate insulating layer is 100 nm or less.

7. A small current measurement device comprising the current-to-voltage converter according to claim 2, the current-to-voltage converter being provided within a cooling device.

8. A small current measurement device comprising the current-to-voltage converter according to claim 3, the current-to-voltage converter being provided within a cooling device.

9. A small current measurement device comprising the current-to-voltage converter according to claim 4, the current-to-voltage converter being provided within a cooling device.

* * * * *